United States Patent
Brahmadathan et al.

(10) Patent No.: US 8,904,082 B1
(45) Date of Patent: Dec. 2, 2014

(54) OPERATION BASED POLLING IN A MEMORY SYSTEM

(75) Inventors: Sandeep Brahmadathan, Trichur (IN); Bikram Banerjee, Kolkata (IN)

(73) Assignee: Cadence Design Systems, Inc., San Jose, CA (US)

( * ) Notice: Subject to any disclaimer, the term of this patent is extended or adjusted under 35 U.S.C. 154(b) by 1218 days.

(21) Appl. No.: 12/054,391

(22) Filed: Mar. 25, 2008

(51) Int. Cl.
*G06F 12/00* (2006.01)
*G06F 3/00* (2006.01)

(52) U.S. Cl.
USPC .................. 711/103; 711/156; 711/E12.008; 710/18; 710/58

(58) Field of Classification Search
USPC .............................. 711/103, 156; 710/18, 58
See application file for complete search history.

(56) References Cited

U.S. PATENT DOCUMENTS

| | | | |
|---|---|---|---|
| 5,404,536 A * | 4/1995 | Ramakrishnan et al. | 710/220 |
| 2007/0005748 A1* | 1/2007 | Ohara et al. | 709/223 |
| 2009/0089492 A1* | 4/2009 | Yoon et al. | 711/103 |
| 2009/0089784 A1* | 4/2009 | Walters | 718/102 |
| 2009/0172213 A1* | 7/2009 | Jayachandran et al. | 710/19 |

* cited by examiner

*Primary Examiner* — Aracelis Ruiz
(74) *Attorney, Agent, or Firm* — Holland & Knight LLP; Mark H. Whittenberger, Esq.

(57) ABSTRACT

Operation based polling in a memory system. A device manager is provided to perform efficient polling by utilizing the effective bandwidth of the memory system, in a controller coupled to a communication end point. The device manager includes a detection module for detecting a type of operation sent to the communication end point. The device manager also includes a storage module for storing a polling interval value based on a time period of the type of operation in a polling counter of the controller. Further, the device manager includes a controlling module for controlling a polling operation of the controller in such a way that the controller polls the communication end point after a wait period according to the polling interval value.

23 Claims, 6 Drawing Sheets

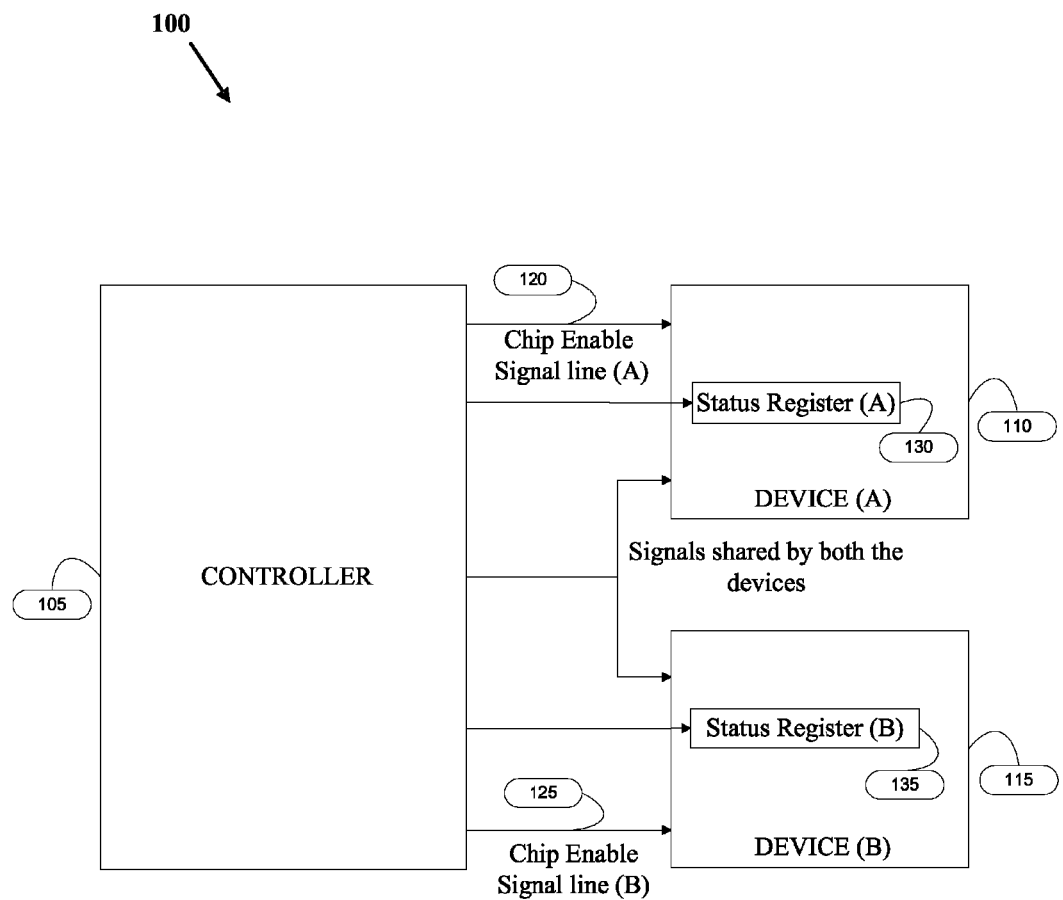
FIG: 1 (Prior Art)

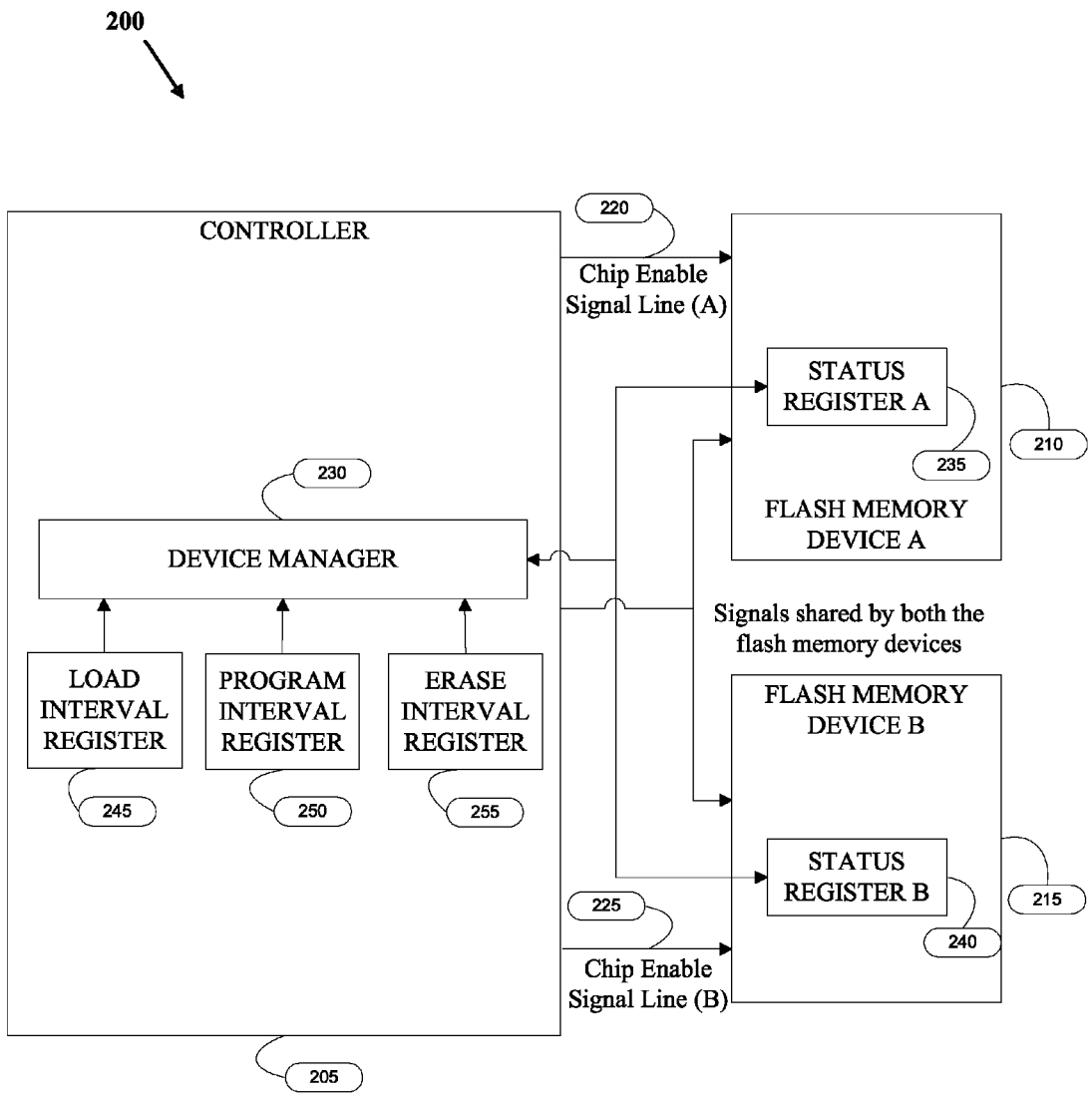
FIG: 2

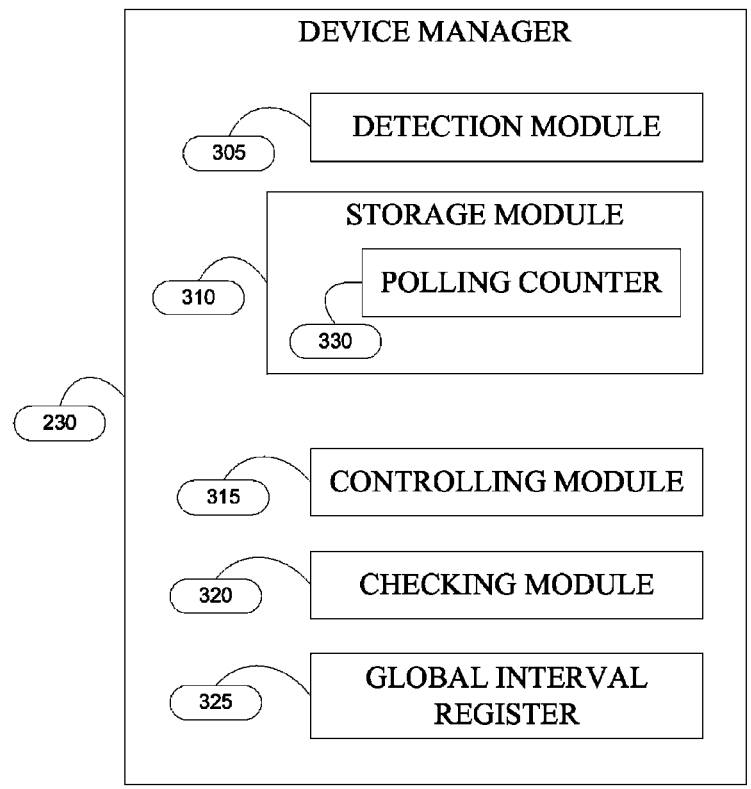
FIG: 3

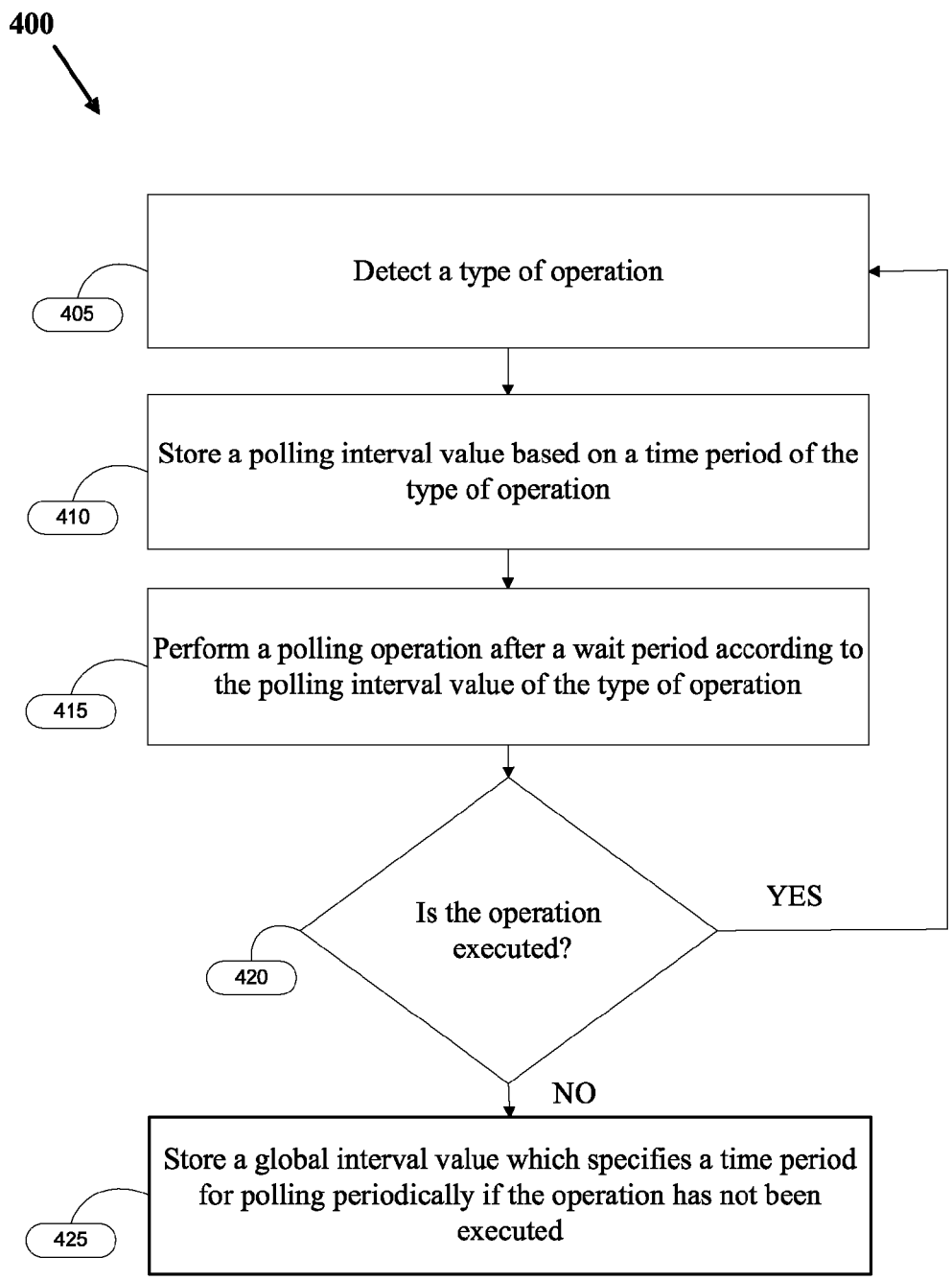
FIG: 4

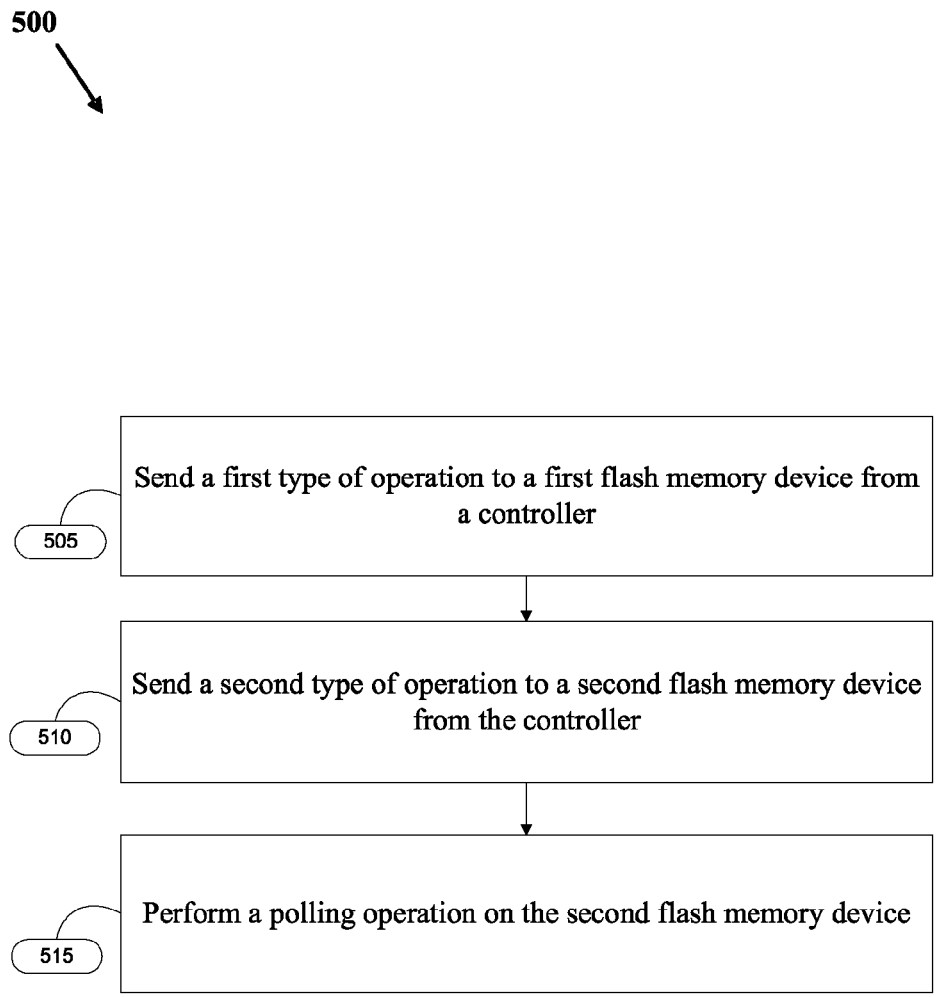
FIG: 5

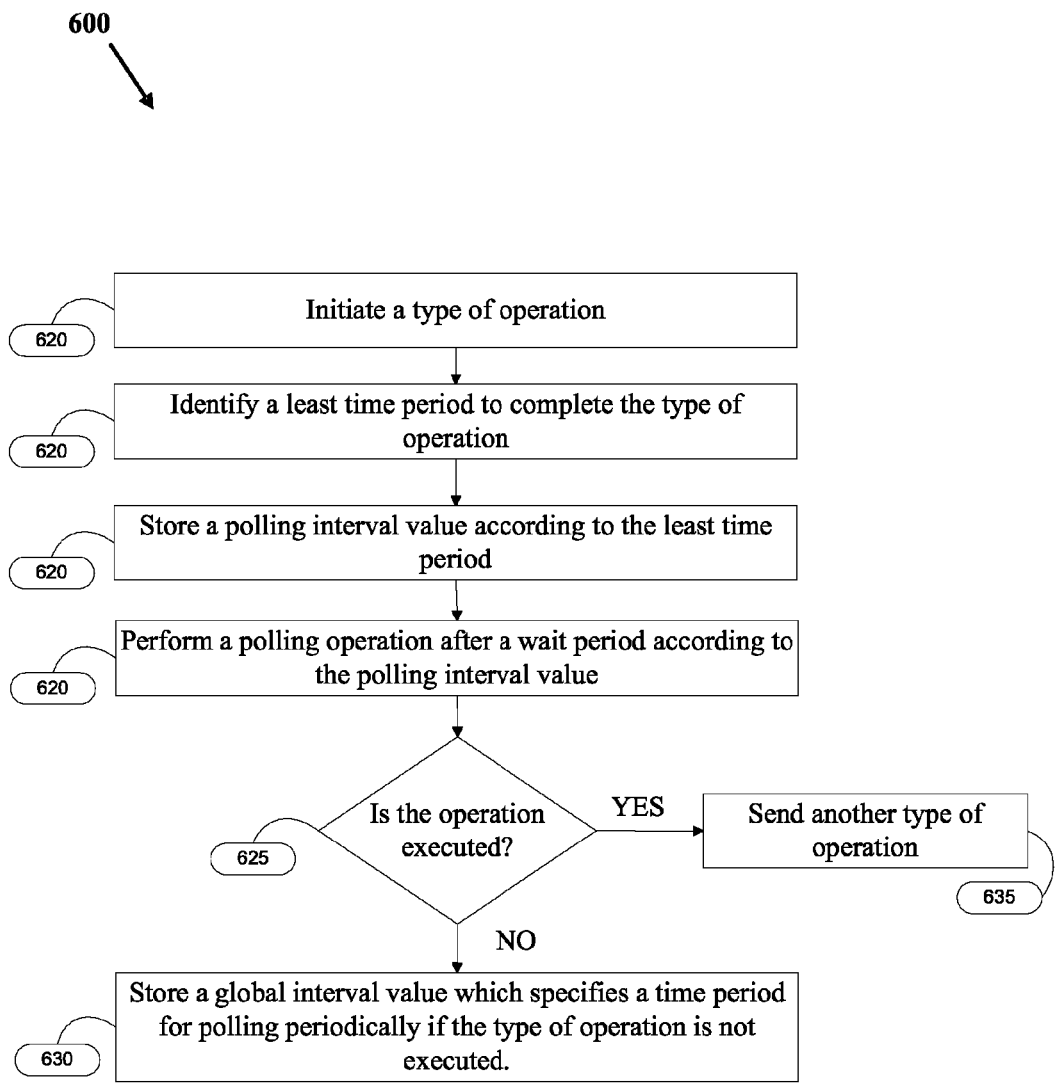
FIG: 6

OPERATION BASED POLLING IN A MEMORY SYSTEM

BACKGROUND

Embodiments of the invention relate generally to memory devices and more particularly to polling methods in memory devices.

An interleaved memory system may include a controller coupled to one or more memory devices. In an interleaved memory system, interleaved operations may be used by the controller to communicate with the one or more memory devices simultaneously. For example, during interleaved operations, the controller may issue a command to a first memory device and may communicate with a second memory device when the first memory device is busy executing the command issued by the controller.

An operational status of the memory device (whether the memory device is busy or ready) may be checked by the controller to determine completion of the command issued to the memory device. In a conventional method for checking the operational status of the memory device, a ready/busy pin of the memory device may be monitored by the controller. Upon execution of the command, the memory device informs the controller that the command has been executed by setting the ready/busy pin. However, in certain memory devices with pin restrictions, the controller is required to function without the ready/busy pins. Polling is another known method to check the operational status of a memory device which is adopted if the controller is required to function without the ready/busy pin. During polling, the operational status of the memory device is checked by polling a status register in the memory device. Polling is further explained in detail in conjunction with FIG. 1.

FIG. 1 is a block diagram illustrating an interleaved memory system 100 operating in a polling mode according to the prior art. The interleaved memory system 100 includes a controller 105 and one or more memory devices coupled to the controller including Device (A) 110 and Device (B) 115. Controller 105 further includes chip enable signal (A) line 120 and chip enable signal (B) line 125. Device (A) 110 and Device (B) 115 further include status register (A) 130 and status register (B) 135 respectively for storing a status of the respective memory devices 110 and 115.

Controller 105 sends commands to a memory device by asserting a chip enable signal to the memory device. The chip enable signal line is used to enable or disable the memory device. For example, controller 105 sends a read command to Device (A) 110 over the line 120 and an erase command to Device (B) 115 over the line 125 respectively. A status register in the device is used to store the status of the device. For example, status register (A) 130 stores the status of Device (A) 110 and status register (B) 135 stores the status of Device (B) 115 respectively. After sending the read command, controller 105 checks if Device (A) 110 is ready by polling the status register (A) 130. If Device (A) 110 is not ready, controller 105 polls that device 110 periodically for a fixed time interval until the device 110 is ready. For example, controller 105 may poll the device 110 after every 5 microseconds. Polling the device 110 periodically for a fixed time interval until the device 110 is ready may result in inefficient usage of the interface bandwidth. Moreover, devices may require different amounts of time to execute different commands. Hence, having a fixed time period to poll the device may result in inefficient use of the bandwidth of the memory system 100.

Once controller 105 detects that Device (A) 110 is ready, data from Device (A) 110 is read. After controller 105 completes reading the data, controller 105 may send another command to Device (A) 110. While communicating with Device (A) 110, controller 105 may proceed to poll status register (B) 135 in order to check if Device (B) 115 is ready. Therefore status register (B) 135 of Device (B) 115 may be polled while the controller is communicating with Device (A) 110. Such polling operations between data transfers also contribute to a net decrease in the effective bandwidth of the memory system 100.

Hence, there is a need for an efficient polling method. Further, there is also a need for maximizing bandwidth of a memory system.

SUMMARY

Embodiments of the invention described herein provide systems and methods for maximizing effective bandwidth of a memory system by using an efficient polling technique.

An exemplary embodiment of the invention provides a device manager for performing efficient polling. The device manager includes a detection module for detecting a type of operation sent to at least one communication end point from a controller. The device manager also includes a storage module for storing a polling interval value based on a time period of a type of operation. Further, the device manager includes a controlling module for controlling a polling operation of the controller. The polling operation is controlled in such a way that the controller polls the at least one communication end point after a wait period according to the polling interval value.

An exemplary embodiment of the invention provides a method for operating a device manager in a controller. A type of operation is detected. Further, a polling interval value based on the type of operation is stored. A polling operation is then performed after a wait period according to the polling interval value of the type of operation An exemplary embodiment of the invention provides a memory system. The memory system includes a controller for initiating a type of operation to at least one flash memory device coupled to the controller. The memory system also includes a device manager in the controller for controlling a polling operation in such way that the controller polls the at least one flash memory device after a wait period according to a polling interval of the type of operation. The device manager further includes a detection module, a storage module and a controlling module for controlling the polling operation.

An exemplary embodiment of the invention provides a method for maximizing effective bandwidth of a memory system. A type of operation is initiated to at least one flash memory device coupled to a controller. A polling operation of the controller is then performed based on the type of operation on the at least one flash memory device. The type of operation sent to the at least one flash memory device is detected. A polling interval value based on a time period of the type of operation is then stored in a polling counter of the controller. Thereafter, the polling operation is controlled in such a way that the controller polls the at least one communication end point after a wait period according to the polling interval value.

An exemplary embodiment of the invention provides an interleaved operation method in a memory system. A first type of operation is sent to a first flash memory device from a controller coupled to the first flash memory device. Further, a second type of operation is sent to a second flash memory device from the controller coupled to the second flash memory device. The second flash memory device is then polled after a wait period according to a polling interval value. The polling interval value corresponds to a time period of a type of operation sent to the second flash memory device.

An exemplary embodiment of the invention provides a method for calculating polling interval values and global interval values. A type of operation is initiated. Further, a polling interval value according to a least time period for completing the type of operation is stored.

Other aspects and example embodiments are provided in the Figures and the Detailed Description that follows.

BRIEF DESCRIPTION OF THE DRAWINGS

FIG. 1 is a block diagram illustrating an interleaved memory system operating in a polling mode according to the prior art;

FIG. 2 is a block diagram illustrating a memory system according to an embodiment of the invention;

FIG. 3 is a block diagram illustrating a device manager used for operation based polling according to an embodiment of the invention;

FIG. 4 is a flow diagram illustrating the steps in a method for performing efficient polling according to an embodiment of the invention;

FIG. 5 is a flow diagram illustrating the steps in an interleaved operation method according to an embodiment of the invention; and FIG. 6 is a flow diagram illustrating the steps in a method for calculating polling interval values and global interval values according to an embodiment of the invention.

DETAILED DESCRIPTION OF THE EMBODIMENTS

Embodiments of the invention described herein provide a system and method for maximizing effective bandwidth of a memory system using an efficient polling technique.

A memory system may include a controller coupled to one or more communication end points in an interleaved operation environment. In the interleaved operation environment, the controller may issue a command to a first flash memory device and may communicate with a second flash memory device while the first flash memory device is executing the command issued by the controller.

Examples of communication end points may include but are not limited to receivers and flash memory devices including NAND flash memory devices and NOR flash memory devices. Embodiments of the invention will be hereafter explained considering the example of flash memory devices. However it will be apparent to one skilled in the art that the teachings of the invention are not limited to flash memory devices. Operation based polling may be adopted to effectively increase the bandwidth of the memory system. The operation based polling is executed by polling the flash memory device according to a polling interval specified by a time period of a type of operation. Operation based polling is explained in detail in conjunction with FIG. 2.

FIG. 2 is a block diagram illustrating a memory system 200 according to an embodiment of the invention. Memory system 200 includes a controller 205 communicating with one or more flash memory devices including flash memory device (A) 210 and flash memory device (B) 215. Controller 205 includes a chip enable signal (A) line 220 and a chip enable signal (B) line 225. The controller 205 also includes a device manager 230 for performing operation based polling. The controller 205 further includes one or more registers including load interval register 245, program interval register 250 and erase interval register 255 for storing a time period based on a type of operation. Flash memory device (A) 210 and flash memory device (B) 215 further include status register (A) 235 and status register (B) 240 for storing a status of respective flash memory devices 210 and 215.

Controller 205 issues a command to a flash memory device (210 or 215) specifying a type of operation to be performed. Examples of controller 205 may include but are not limited to processors, control circuitry, multimedia media controllers and the like. A chip enable signal line is used to enable or disable the flash memory device (210 or 215). For example, chip enable signal line (A) 220 is used to enable or disable flash memory device (A) 210. Similarly, chip enable signal line (B) 225 is used to enable or disable flash memory device (B) 215.

The device manager 230 of the controller 205 performs operation based polling on a status register (235 or 240) of the flash memory device (210 or 215) to check if the command issued to the flash memory device (210 or 215) has been executed. The status register (235 or 240) stores a status (whether the flash memory device is ready or busy) of the flash memory device (210 or 215). For example, status register (A) 235 stores the status of flash memory device (A) 210 and status register (B) 240 stores the status of flash memory device (B) 215 respectively. The operation based polling performed by the device manager 230 is explained in detail in the next paragraphs.

The device manager 230 detects a type of operation issued to the flash memory device (210 or 215). Types of operations may include but are not limited to a load operation, a program operation and an erase operation. After detecting the type of operation, the device manager 230 stores a polling interval value based on a time period of the type of operation in a polling counter, 330 as shown in FIG. 3. The device manager 230 further controls a polling operation in such a way that the device manager 230 polls the flash memory device (210 or 215) after a wait period according to the polling interval value. In an embodiment of the invention, the polling counter is updated with the polling interval value from the one or more registers (245 or 250 or 255) of the controller 205 depending on the operation issued to the flash memory device (210 or 215). Different operations may be completed in different intervals of time. For example, the load operation may be completed in 30 microseconds. Similarly, the program operation and the erase operation may be completed in 800 microseconds and 2 milliseconds respectively. In an embodiment of the invention, the time period based on the type of operation is predetermined and stored in the one or more registers (245 or 250 or 255) of the controller 205. For example, load interval register 245, program interval register 250 and erase interval register 255 store interval values based on the load operation, the program operation and the erase operation respectively. Device manager 230 is explained in detail in conjunction with FIG. 3

System 200 described above may include a greater or a fewer number of modules than those included in FIG. 2.

FIG. 3 is a block diagram illustrating a device manager 230 of FIG. 2 used for operation based polling according to an embodiment of the invention. The device manager 230 includes one or more modules for performing operation based polling including a detection module 305, a storage module 310, a controlling module 315, a checking module 320 and a global interval register 325. The storage module 310 further includes a polling counter 330 for storing a polling interval value.

A controller 205 sends a command to a flash memory device (210 or 215) specifying an operation to be performed.

Detection module 305 is used for detecting a type of operation sent to the flash memory device (210 or 215). Types of operations may include but are not limited to a load operation, a program operation and an erase operation. Storage module 310 is used for storing a polling interval value based on a time period of the type of operation in a polling counter 330 of the controller 205. In an embodiment of the invention, the controller 205 includes a polling counter 330 for each flash memory device (210 and 215) coupled to the controller 205. The polling counter 330 may be updated with the polling interval value from one or more registers (245 or 250 or 255) of the controller 205, depending on the operation issued to the flash memory device (210 or 215). The time period based on the type of operation is predetermined and stored in the one or more registers (245 or 250 or 255) of the controller 205.

The device manager 230 checks if the command sent to the flash memory device (210 or 215) has been executed by polling a status register (235 or 240) of the flash memory device (210 or 215). Controlling module 315 is used for controlling the polling operation. The polling operation is controlled in such a way that the device manager 230 polls the flash memory device (210 or 215) after a wait period according to the polling interval value of the type of operation. The wait period of the polling operation is predetermined so that the flash memory device (210 or 215) may be polled just before the lapse of the time period or at the lapse of the time period. Checking module 320 is used for checking if the flash memory device (210 or 215) is ready after the wait period. A global interval register 325 stores a global interval value which specifies a time period at which the device manager 230 polls the flash memory device (210 or 215) periodically. The Checking module 320 performs a check on a status register of the flash memory device (210 or 215). If the flash memory device (210 or 215) is not ready, the device manager 230 polls the flash memory device (210 or 215) periodically according to the global interval value till the flash memory device (210 or 215) is ready.

In an embodiment of the invention, device manager 230 is operable in any communication environment wherein the controller 205 is required to perform a polling operation. In another embodiment of the invention, device manager 230 may be a software module stored in the controller 205. In yet another embodiment of the invention, device manager 230 may be stored in the flash memory device (210 or 215) coupled to the controller 205. The processor of the memory system can execute the device manager 230 by reading the code from the corresponding flash memory device (210 or 215). Detection module 305, controlling module 315 and checking module 320 may include one or more algorithms.

Device manager 230 described above may include a greater or a fewer number of modules than those included in FIG. 3.

FIG. 4 is a flow diagram 400 illustrating the steps in a method for performing efficient polling according to an embodiment of the invention. The method for performing operation based polling is explained in detail in the following paragraphs.

At step 405, the type of operation is detected. In an embodiment of the invention, one or more algorithms may be used to detect the type of operation. As explained earlier, types of operations may include but are not limited to a load operation, a program operation and an erase operation.

At step 410, a polling interval value based on a time period of the type of operation is stored. In an embodiment of the invention, the polling interval value corresponds to a time period required for executing the type of operation.

At step 415, a polling operation is performed after a wait period according to the polling interval value of the type of operation. For example, the wait period according to the polling interval value of the load operation may be 30 microseconds. The wait period of the polling operation is predetermined so that polling may take place just before the lapse of the time period or at the lapse of the time period. Therefore, if the polling interval value is 30 microseconds, polling may take place either at the 29$^{th}$ microsecond or at the 30$^{th}$ microsecond. In an embodiment of the invention, one or more algorithms may be used in order to decide the precise time period for polling.

At step 420, a check is performed to determine if the type of operation has been executed. If the type operation has not been executed, step 425 is performed, else steps 405 to 415 are performed.

At step 425, a global interval value is stored which specifies a time period for polling periodically if the operation has not been executed. In an embodiment of the invention, the global interval value is a fixed time interval and may be programmed using one or more algorithms. In another embodiment of the invention, a default value may be stored as the global interval value. Thereafter, periodic polling is performed according to the global interval value till the type of operation is executed.

FIG. 5 is a flow diagram 500 illustrating steps in an interleaved operation method for a memory system for efficient communication with one or more flash memory devices.

A controller 205 may be communicating with one or more flash memory devices (210 and 215) and operates in an interleaved operation environment. Interleaved operations may be used by the controller 205 to communicate with the one or more flash memory devices (210 and 215) simultaneously. For example, during interleaved operations, the controller 205 may issue a command to a first flash memory device (210 or 215) and may communicate with a second flash memory device (210 or 215) when the first memory device (210 or 215) is executing the command issued by the controller 205. The interleaved operation method is explained in detail in the following paragraphs.

At step 505, a first type of operation is sent to a first flash memory device (210 or 215) from a controller 205. For example, the controller 205 sends an erase operation to the first flash memory device (210 or 215). At step 510, a second type of operation is sent to a second flash memory device (210 or 215) from the controller 205. For example, the controller 205 sends a load operation to the second flash memory device (210 or 215). At step 515, a polling operation is performed on the second flash memory device (210 or 215). The polling operation is explained in detail in the following paragraphs.

The polling operation is performed using steps 405 to 430 of FIG. 4. The type of operation sent to the second flash memory device (210 or 215) is detected. A polling interval value based on a time period of the second type of operation is then stored in a polling counter corresponding to the second flash memory device (210 or 215). As considered in the example, a polling interval value of 30 microseconds based on the load operation is stored in the polling counter. The controller 205 checks if the second flash memory device (210 or 215) is ready by polling a status register (235 or 240) of the second flash memory device (210 or 215). The controller 205 polls the second flash memory device (210 or 215) according to a wait period corresponding to the polling interval. The wait period of the polling operation is predetermined so that the flash memory device (210 or 215) may be polled just before the lapse of the time period or at the lapse of the time period. Therefore, if the polling interval is 30 microseconds, the controller 205 may poll the status register (235 or 240) of the flash memory device (210 or 215) either at the 29$^{th}$ micro second or at the 30$^{th}$ micro second. Since the wait period is predetermined, the device manager 230 does not perform periodic polling to check if the second flash memory device (210 or 215) is ready. Further, during the wait period the controller 205 can perform other operations, for example, the controller 205 can communicate with the first flash memory device (210 or 215).

The interleaved operation method illustrated above helps in maximizing the bandwidth of a system. Moreover, in an interleaved operation environment, wherein the controller 205 may be coupled to multiple flash memory devices (210 and 215), the above illustrated method enables the controller 205 to efficiently utilize the interface bandwidth in order to perform operations simultaneously.

FIG. 6 is a flow diagram 600 illustrating the steps for calculating polling interval values and global interval values according to an embodiment of the invention. The polling interval values and global interval values are calculated at the initialization of a controller. The controller may be communicating with one or more flash memory devices. For example, the controller may be communicating with flash memory devices 210 and 215. The steps for controlling the polling operation are explained in the following paragraphs.

At step 605, a type of operation is initiated. The type of operation may be initiated to the flash memory devices 210 and 215. The type of operation may include but not limited to, a load operation, a program operation and an erase operation. For example, an erase operation may be initiated to the flash memory devices 210 and 215. At step 610, a least time period for completing the type of operation is identified. The time taken by the flash memory devices 210 and 215 to complete the erase operation is compared and the least time period is identified. At step 615, a polling interval value according to the least time period is stored.

In an embodiment of the invention, the least time period is identified for different types of operations and a polling interval value according to the least time period based on the respective type of operation is stored. For example, the least time period for completing the load operation and the program operation may be determined. The polling interval values according to the least time period of the load operation and the program operation may then be stored.

After storing the polling interval value based on the respective type of operation, a type of operation may be sent to a flash memory device (210 or 215). Further, according to the embodiment of the invention, the type of operation sent to the flash memory device (210 and 215) is detected. For example a load operation is sent to the flash memory device (210 or 215). At step 620, a polling operation is performed after a wait period according to the polling interval value. The polling interval value based on the load operation may be 25 microseconds. As explained earlier, the wait period of the polling operation is predetermined so that the flash memory device (210 or 215) may be polled just before the lapse of the time period or at the lapse of the time period. Further at step 625, a check is performed to determine if the operation is executed. If the operation is not executed, step 630 is performed else step 635 is performed.

At step 630, a global interval value which specifies a time period for polling periodically, if the type of operation is not executed, is stored. In an embodiment of the invention, the global interval value is predetermined and may be a function of the polling interval value. The function may include a percentage of the polling interval that may be calculated using a software or one or more algorithms. As considered in the example, the polling interval value based on the load operation may be 25 microseconds. The global interval value may be determined as 10% of the polling interval value, which is equivalent to 2.5 microseconds. Further, the global interval value may be stored subsequent to calculating the polling interval of the respective type of operation. In another embodiment of the invention a default value may be stored as the global interval value irrespective of the respective type of operation.

In an embodiment of the invention, the controller may perform different types of periodic polling based on the global interval value. For example, the controller may perform periodic polling on flash memory device 210, at step 630, according to a global interval value as a function of the polling interval value for the respective type of operation. Contrarily, the controller may perform periodic polling on flash memory device 215, at step 630, according to a default value stored as the global interval value. Further, the efficiency of flash memory devices may reduce with time. Hence, identification of the least time period for completing the type of operation may be performed periodically. The polling interval values and the global interval values may then be re-programmed accordingly for better efficiency and accuracy.

At step 635, another type of operation is sent, if the type of operation is executed and steps 405 to 420 of FIG. 4 are performed according to the embodiment of the invention.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A device manager comprising:
    a detection module for detecting a type of operation sent to two or more communication end points from a controller;
    a storage module for storing a polling interval value based on a least time period for completing the type of operation, wherein the least time period is determined by comparing time periods for completing the type of operation for the two or more communication end points; and
    a control module for controlling a polling operation of the controller in such a way that the controller polls the two or more communication end points after a wait period according to the polling interval value of the type of operation, wherein the controller operates in an interleaved operation environment, the controller coupled to a plurality of flash memory devices, wherein the controller allows for simultaneous communication with each of the plurality of flash memory devices.

2. The device manager of claim 1 further comprising:
    a checking module for checking if the at least one communication end point is ready after the wait period; and
    a global interval register for storing a global interval value which specifies a time period at which the controller polls the two or more communication end points periodically if the two or more communication end points are not ready.

3. The device manager of claim 2, wherein the global interval value is a function of the type of operation.

4. The device manager of claim 2, wherein the global interval value is a fraction of the least time period.

5. A method for operating a device manager comprising:
detecting a type of operation;
storing a polling interval value based on a time period for completing the type of operation, wherein the time period is determined by comparing time periods for completing the type of operation for a plurality of devices; and
controlling a polling operation of a controller in such a way that the controller polls two or more communication end points after a wait period according to the polling interval value of the type of operation, wherein the controller operates in an interleaved operation environment, the controller coupled to a plurality of flash memory devices, wherein the controller allows for simultaneous communication with each of the plurality of flash memory devices.

6. The method of claim 5 further comprising:
storing a global interval which specifies a time period for polling periodically if the type of operation is not executed.

7. The method of claim 6, wherein the global interval value is a function of the polling interval value.

8. A memory system comprising:
a controller for initiating a type of operation to two or more flash memory devices coupled to the controller; and
a device manager in the controller for controlling a polling operation of the memory system, the device manager comprising:
a detection module for detecting a type of operation sent to the two or more flash memory devices from the controller, the two or more flash memory devices coupled to the controller;
a storage module for storing a polling interval value based on a least time period for completing the type of operation, wherein the least time period is determined by comparing time periods for completing the type of operation for the two or more flash memory devices;
a polling counter for each of the two or more flash memory devices; and
a controlling module for controlling a polling operation of the controller in such a way that the controller polls the two or more flash memory devices after a wait period according to the polling interval value of the type of operation, wherein the controller operates in an interleaved operation environment, the controller coupled to a plurality of flash memory devices, wherein the controller allows for simultaneous communication with each of the plurality of flash memory devices.

9. The memory system of claim 8, wherein the device manager further comprises:
a checking module for checking if the two or more flash memory devices is are ready after the wait period; and
a global interval register for storing a global interval value which specifies a time period at which the controller polls the two or more flash memory devices periodically if the two or more flash memory devices are not ready.

10. The memory system of claim 9, wherein the device manager is implemented as software instruction code and stored in each of the two or more flash memory devices.

11. The memory system of claim 8, wherein the two or more flash memory devices comprises a NAND flash memory device.

12. The memory system of claim 8, wherein the type of operation is selected from the group comprising a load operation, a program operation and an erase operation.

13. A method comprising:
initiating a type of operation to two or more flash memory devices coupled to a controller;
determining a time period for completing the type of operation by comparing time periods for completing the type of operation for the two or more flash memory devices; and
performing a polling operation of the controller on the two or more flash memory devices based on the type of operation, wherein performing a polling operation comprises:
detecting the type of operation sent to the two or more flash memory devices from the controller, the two or more flash memory devices coupled to the controller;
storing a polling interval value based on a time period for completing the type of operation in a polling counter of the controller; and
controlling a polling operation of the controller in such a way that the controller polls the two or more flash memory devices after a wait period according to the polling interval value of the type of operation, wherein the controller operates in an interleaved operation environment the controller coupled to a plurality of flash memory devices, wherein the controller allows for simultaneous communication with each of the plurality of flash memory devices.

14. The method of claim 13, wherein performing a polling operation further comprises:
checking if the two or more flash memory devices is ready after the wait period; and
storing a global interval value which specifies a time period at which the controller polls the two or more flash memory devices periodically if the two or more flash memory devices are not ready.

15. The method of claim 14, wherein checking if the at least one flash memory device is ready comprises:
checking a status register of the at least one flash memory device; and
polling the at least one flash memory device periodically until the at least one flash memory device is ready.

16. An interleaved operation method in a memory system comprising:
sending a first type of operation to a first flash memory device from a controller, the first flash memory device coupled to the controller;
sending a second type of operation to a second flash memory device from the controller, the second flash memory device coupled to the controller; and
polling the second flash memory device after a wait period so that the controller can efficiently communicate with the first flash memory device by utilizing the effective bandwidth of the memory system, polling the second flash memory device after a wait period comprising:
detecting the second type of operation sent to the second flash memory device;
storing a polling interval value based on a least time period for completing the second type of operation in a polling counter of the controller, wherein the least time period is determined by comparing time periods for completing the second type of operation for the first and the second flash memory devices; and
controlling a polling operation of the controller in such a way that the controller polls the second flash memory device after a wait period according to the polling interval value of the type of operation, wherein the controller operates in an interleaved operation environment, the controller coupled to a plurality of flash memory devices, wherein the controller allows for simultaneous communication with each of the plurality of flash memory devices.

17. The interleaved operation method of claim 16, wherein polling the second flash memory device comprises:
checking if the second flash memory device is ready after the wait period; and
storing a global interval value which specifies a time period at which the controller polls the second flash memory device periodically if the second flash memory device is not ready.

18. The interleaved operation method of claim 17, wherein checking if the second flash memory device is ready comprises:
checking a status register of the second flash memory device; and
polling the at least one flash memory device periodically until the second flash memory device is ready.

19. The interleaved operation method of claim 17, wherein the global interval value is a function of the type of operation.

20. An initialization method in a memory system comprising:
initiating a type of operation;
determining a least time period for completing the type of operation, wherein the least time period is determined by comparing time periods for completing the type of operation for a plurality of memory devices;
storing a polling interval value according to the least time period for completing the type of operation; and
controlling a polling operation of a controller in such a way that the controller polls two or more communication end points after a wait period according to the polling interval value of the type of operation, wherein the controller operates in an interleaved operation environment, the controller coupled to a plurality of flash memory devices, wherein the controller allows for simultaneous communication with each of the plurality of flash memory devices.

21. The initialization method of claim 20 further comprising:
polling after a wait period according to the polling interval value; and
storing a global interval value which specifies a time period for polling periodically, if the type of operation is not executed.

22. The initialization method of claim 21, wherein the global interval value is a fraction of the least time period.

23. The initialization method of claim 21, wherein storing a global interval value comprises storing a value that is a function of the polling interval value as the global interview value.

* * * * *